United States Patent
Shimizu

(10) Patent No.: US 9,252,745 B2
(45) Date of Patent: Feb. 2, 2016

(54) WHITENING FILTER CONFIGURATION METHOD, PROGRAM, AND SYSTEM

(71) Applicant: International Business Machines Corporation, Armonk, NY (US)

(72) Inventor: Junya Shimizu, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 325 days.

(21) Appl. No.: 13/919,345

(22) Filed: Jun. 17, 2013

(65) Prior Publication Data

US 2014/0040340 A1    Feb. 6, 2014

(30) Foreign Application Priority Data

Jul. 31, 2012 (JP) .................. 2012-169207

(51) Int. Cl.
  G06F 17/10 (2006.01)
  H03H 17/02 (2006.01)
(52) U.S. Cl.
  CPC ....... H03H 17/0294 (2013.01); H03H 17/0255 (2013.01)
(58) Field of Classification Search
  None
  See application file for complete search history.

(56) References Cited

U.S. PATENT DOCUMENTS 5,721,694 A * 2/1998 Graupe .......................... 702/191
6,470,044 B1   10/2002 Kowalski
2008/0004869 A1 * 1/2008 Herre et al. ................... 704/211
2010/0241433 A1 * 9/2010 Herre et al. ................... 704/500
2012/0140656 A1 * 6/2012 Wigren et al. ................ 370/252
2013/0041659 A1 * 2/2013 Douglas et al. .............. 704/226
2014/0040340 A1 * 2/2014 Shimizu ........................ 708/311

FOREIGN PATENT DOCUMENTS

JP    2000224077 A    8/2000
JP    2008199602 A    8/2008
JP    2014030074 A    2/2014

OTHER PUBLICATIONS

Hiroyuki Tsuji et al., "Determination of the Number of Sinusoidal Signals in AR Spectral Estimation", Electronics and Communications in Japan, Part 3, vol. 75, No. 8, 1992, pp. 19-33, Translated from Denshi Joho Tsushin Gakkai Ronbunshi, vol. 74-A, No. 9, pp. 1374-1384, Sep. 1991.

Takaya Inamori et al., "Attitude control system for the nano-astrometry satellite "Nano-JASMINE"", International Journal of Aircraft Eng. and Aerospace Technology, pp. 221-228, 2011.

(Continued)

*Primary Examiner* — David H Malzahn
(74) *Attorney, Agent, or Firm* — Erik Johnson; Vazken Alexanian

(57) ABSTRACT

A system is configured so that signals passed through an all-pass filter using warp parameter $\lambda$ are whitening-filtered, and so that the frequency axis is restored by an all-pass filter using warp parameter $\lambda$. This optimizes the whitening filter by determining the optimum $\lambda$. First, the AR order p is automatically estimated using $\lambda=0$. A spectral distance $d\lambda$ is computed using a discrete Fourier transform spectrum value passed through an all-pass filter using warp parameter $\lambda$ and a discrete AR spectrum value passed through an all-pass filter using warp parameter $\lambda$. The $\lambda$ which minimizes the spectral distance $d\lambda$ is set as the warp parameter, and a whitening filter is configured in which the warp parameter has been optimized.

13 Claims, 5 Drawing Sheets

(56) References Cited

OTHER PUBLICATIONS

Abstracts of Murata et al., "A Precision Pole Estimation Method Based on AR Process and an Application to the NMR Structural Analysis", IEICE Transactions on Fundamentals of Electronics, Communications and Computer Sciences (Japanese Edition), vol. J91-A, No. 8, Aug. 1, 2008, 1 page.

English Summary for Hiroyuki et al., "Number method for determining sine wave signal in the AR spectral estimation", IEICE A, vol. J74-A, No. 9, Sep. 20, 1991, 1 page.

* cited by examiner

WHITENING FILTER CONFIGURATION METHOD, PROGRAM, AND SYSTEM

The present application claims the benefit of priority of Japanese Patent Application Serial Number 2012-169207, filed Jul. 31, 2012 with the Japanese Patent Office (JPO), the contents of which are herein incorporated by reference in its entirety.

TECHNICAL FIELD

The present invention relates to a configuration technique for a whitening filter that removes colored noise.

BACKGROUND

Precision pole estimation methods are currently used in a wide variety of fields, such as DNA structural analysis in nuclear magnetic resonance spectroscopy (NMR) (see, for example, Murata, Kubota, "Precision Pole Estimation Method Based on AR Process and an Application to the NMR Structural Analysis", IEICE A, Vol. J91-A, No. 8, pp. 772-781, August 2008).

Plans are in the works to launch and operate extremely small satellites called "nano-satellites" at much lower cost than conventional satellites, and disturbance component analysis of attitude control signals for nano-satellites is one of the fields in which precision pole estimation methods are used.

Because nano-satellites are artificial satellites of an unprecedented small size, attitude control plays an important role in observation precision, and these controls have to be performed adaptively. Because the orbital altitude is also lower than before, the disturbances from the natural environment are also different, and the effects of residual magnetic torque are much higher (see, for example, T. Inamori, N. Sako, S. Nakasuka, "Attitude Control System For the Nano-Astrometry Satellite Nano-JASMINE", International Journal of Aircraft Eng. and Aerospace Technology, pp. 221-228, 2011). This means disturbance factors related to observation results include a closed-loop control system that is an adaptive system with very short times, and plant impacts that cannot be assumed based on experience with conventional artificial satellites. Usually, external disturbances affecting artificial satellites pose difficult problems for low-frequency band signals.

In the prior art, as described, for example, in Japanese Laid-open Patent Publication No. 2000-224077 and Japanese Laid-open Patent Publication No. 2008-199602, controls and observations are performed based on the assumption that all disturbances are white Gaussian signals. However, actually, the low SN ratio signals mentioned above have many unknown frequency signals (multi-tone signals) embedded in the noise. If low SN ratio multi-tone signals are whitened or transformed to a level of disturbance that can be disregarded via modeling and reverse filtering, control and observation precision can be improved. Therefore, an effective technique is required for this modeling.

Identifying an observation signal system as an auto-regressive (AR) model and then applying a reverse filter of this is believed to be effective. In the case of the precision estimations described in Non-patent Literature 1, the effect is often weak on disturbances. However, a technique has been proposed in which an estimation of the number of sine waves is performed based on eigenvalue distributions, etc. even when the SN ratio is negative (see, for example, Tsuji, Ohmori, Sano, "Determination of Number of Sinusoidal Signals in AR Spectral Estimation," IEICE A, Vol. J74-A, No. 9, pp. 1374-1384, September 1991), but this differs from a parameter estimation that is able to configure a spectrum envelope.

Therefore, what is needed for nano-satellite control is automatic precision estimation in which there is bias in the pole distribution based on a low SN ratio at a level for configuring a reverse filter, that is, based on observation signals of several dB, and in which the pole spectrum envelope is not destroyed.

SUMMARY OF THE INVENTION

Therefore, it is an object of the present invention to provide a technique for automatically configuring a whitening filter in which the frequency warp parameter has been optimized for improving to the necessary level the resolution of the frequency bands in which the poles are concentrated.

It is another object of the present invention to provide a technique for constituting a reverse (whitening) filter which performs AR system identification while both enhancing the resolution of bands with spectral peaks and storing, within an acceptable range, the Fourier power spectrum of the original signals (low SN ratio multi-tone signals) in order to reduce the effect of disturbances on low SN ratio multi-tone signals, thereby performing the identification process with fewer errors than techniques based on conventional order optimization criteria.

The present invention constitutes a system which processes signals passed through an all-pass filter with a warp parameter $\lambda$ using a whitening filter, and afterwards restores the frequency axis using an all-pass filter with warp parameter $-\lambda$. This whitening filter is optimized by determining the optimum $\lambda$.

First, the system of the present invention automatically estimates AR order p in which $\lambda=0$. Here, the order estimation preferably performs an automatic estimation for low SN ratio multi-tone signals (the original signals) using Akaike information criterion (AIC). However, another order estimation criterion can be used where appropriate.

In the system of the present invention, a spectral distance $d\lambda$ is computed which uses a discrete Fourier transform spectrum value passed through an all-pass filter with warp parameter $\lambda$, and a discrete AR spectrum value passed through an all-pass filter with warp parameter $\lambda$.

Because warp parameter $\lambda$ has a locally optimized value in the neighborhood of each $\lambda$, the system of the present invention initially extracts that which has been unfalsified by a spectral distance of d0 or less with the warp-free original signals. The set of initial $\lambda$ candidates may be those in the range of $|\lambda|<1$ established at equal intervals. When appropriate, an intensive set of candidates may be established. At this time, the neighborhood search method may be some other than a direct search.

Next, the system of the present invention computes an $\alpha$-trimmed spectral distance $d\lambda$ to automatically determine the AR resolution analysis of the low SN ratio multi-tone signals, and determine the optimum warp parameter $\lambda$. Here, the $\alpha$-trimmed (process) means the N-point spectral bin from 0 to $\pi$ is sorted by size and non-linear filtering is performed to continuously select "$\alpha$" bins when computed using a 2N-point discrete spectrum with a normalized frequency from 0 to $2\pi$.

In the system of the present invention, an $\alpha$-trimmed mean square error (MSE) is computed for the discrete Fourier transform (DFT) spectrum and the discrete AR spectrum. Even when the warped DFT spectrum differs materially from the original signals only by the spectral distance, the $\alpha$-trimmed MSE distance is often smaller (the poles are crushed by the reverse warp, etc.). Here, the α-trimmed ratio is preferably multiplied by the peak power of the DFT spectrum of the original signals as a penalty result.

The α-trimmed MSE distance according to the penalty result is used also as a distance criterion when a direct search is performed for locally optimized values in the neighborhood of a candidate λ.

After the optimized warp parameter has been determined, the system of the present invention performs all-pass filtering using this λ to estimate the AR parameter. Afterwards, reverse filtering is performed using this estimation parameter to restore the resolution warped by the all-pass filtering using −λ.

The present invention automatically configures a whitening filter able to operate with low SN ratio multi-tone signals while incurring only small errors.

DETAILED DESCRIPTION OF EMBODIMENTS

Figure 1:
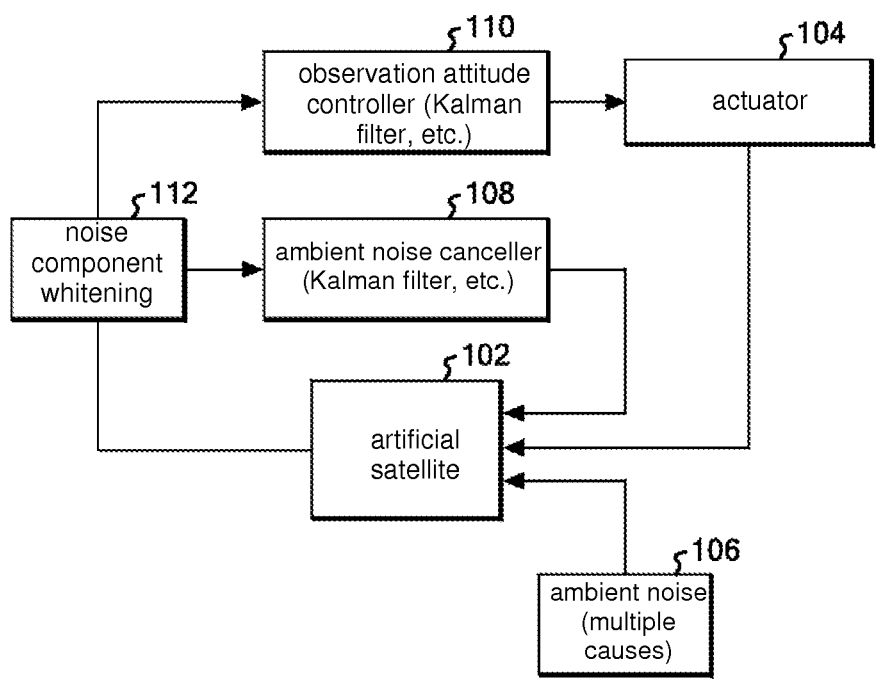
FIG. 1 is a block diagram of a control system for an artificial satellite.

The following is an explanation of examples of the present invention with reference to the drawings. In the drawings, the same objects are denoted by the same reference symbols unless otherwise indicated. The following explanation is an embodiment of the present invention, and it should be understood that the present invention is in no way limited to the embodiment shown here.

FIG. 1 is a block diagram of a control system for an artificial satellite. In FIG. 1, the artificial satellite 102 is driven and controlled by an actuator 104. The actuator 104 is involved in the system related to attitude control, the system related to propulsion, and other systems.

The artificial satellite 102 travels in orbit while being subjected to a variety of disturbances such as distortions of the gravity field, the gravitational pull of the sun and moon, solar winds, air molecules in the atmosphere, and ions. These disturbances are indicated as ambient noise 106 in FIG. 1.

Because the orbit and attitude of the artificial satellite 102 are disturbed by these ambient noises 106, the satellite has a servo system which acquires information from sensors such as attitude control information, and provides these observation signals to the actuator 104 as feedback.

Because the observation signals from the sensors of the artificial satellite 102 include noise caused by this ambient noise 106, the observation signals are provided as feedback to the artificial satellite 102 via an ambient noise canceller 108. The ambient noise canceller 108 uses, for example, a Kalman filter to remove noise from the observation signals. The observation attitude controller 110 used to input control signals to the actuator 104 to control the attitude of the satellite also uses, for example, a Kalman filter to remove noise from the observation signals.

The Kalman filter currently used in the ambient noise canceller 108 and the observation attitude controller 110 is designed on the assumption that the noise contained in observation signals is white noise, but this does not pose much of a problem in the case of relatively large artificial satellites.

However, in the case of small artificial satellites, which travel at lower altitudes as mentioned earlier, the disturbance factors differ from those of large artificial satellites, and the closed-loop control system has very short response times. Because of these differences, when an assumption is made that the noise contained in the observation signals is white noise, proper control can be difficult.

The invention in the present application provides a filter 112 for whitening the noise components in observation signals with a low SN ratio.

Figure 2:
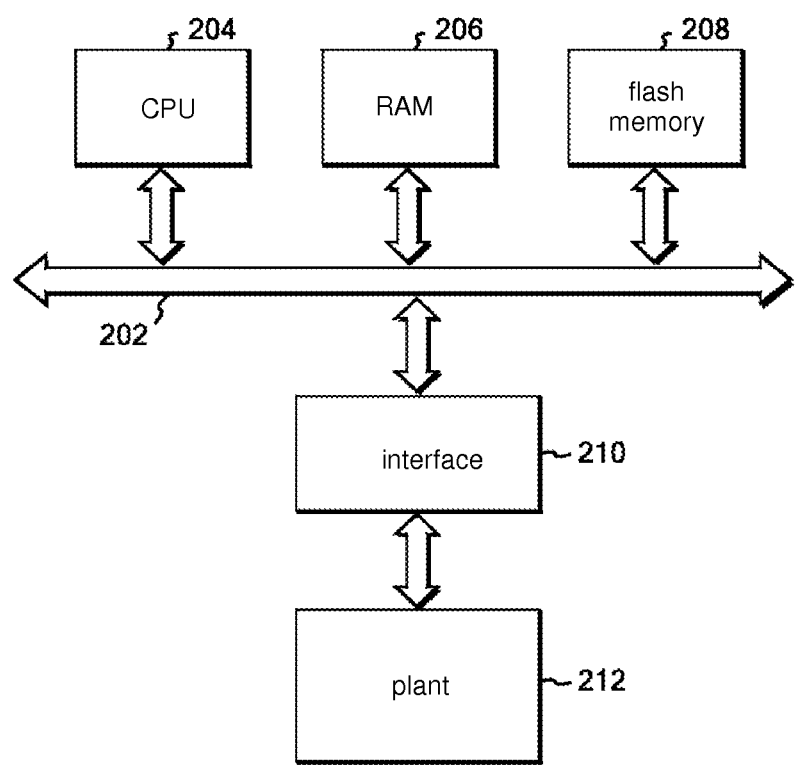
FIG. 2 is a block diagram of a computer hardware configuration used to embody the present invention.

FIG. 2 is a block diagram of a computer hardware configuration used to embody the present invention.

In FIG. 2, a CPU 204, main memory (RAM) 206, and flash memory 208 are connected to a system bus 202. A plant 212 and various sensors (not shown) are also connected to the system bus 202 via a particular interface card 210 such as PCI or USB.

The CPU 204 can be any processor compatible with the incorporated system such as a processor with an Intel® 386EX, Power PC, or ARM® architecture.

The incorporated operating system such as Linux®, control programs for the ambient noise canceller 108 and the observation attitude controller 110 shown in FIG. 1, a whitening filter of the present invention and its configuration module 112, and a control model for the rest of the system are stored in the flash memory 208. The modules are loaded into the main memory 206 and executed on system start-up or whenever necessary.

The plant 212 refers to the artificial satellite body 102, the actuator 104, and the various sensors. The plant receives control signals from the ambient noise canceller 108 and the observation attitude controller 110 via the interface 210 and is operated. The control program operated by the CPU 204 also receives observation signals from the plant 212 via the interface 210.

Figure 3:
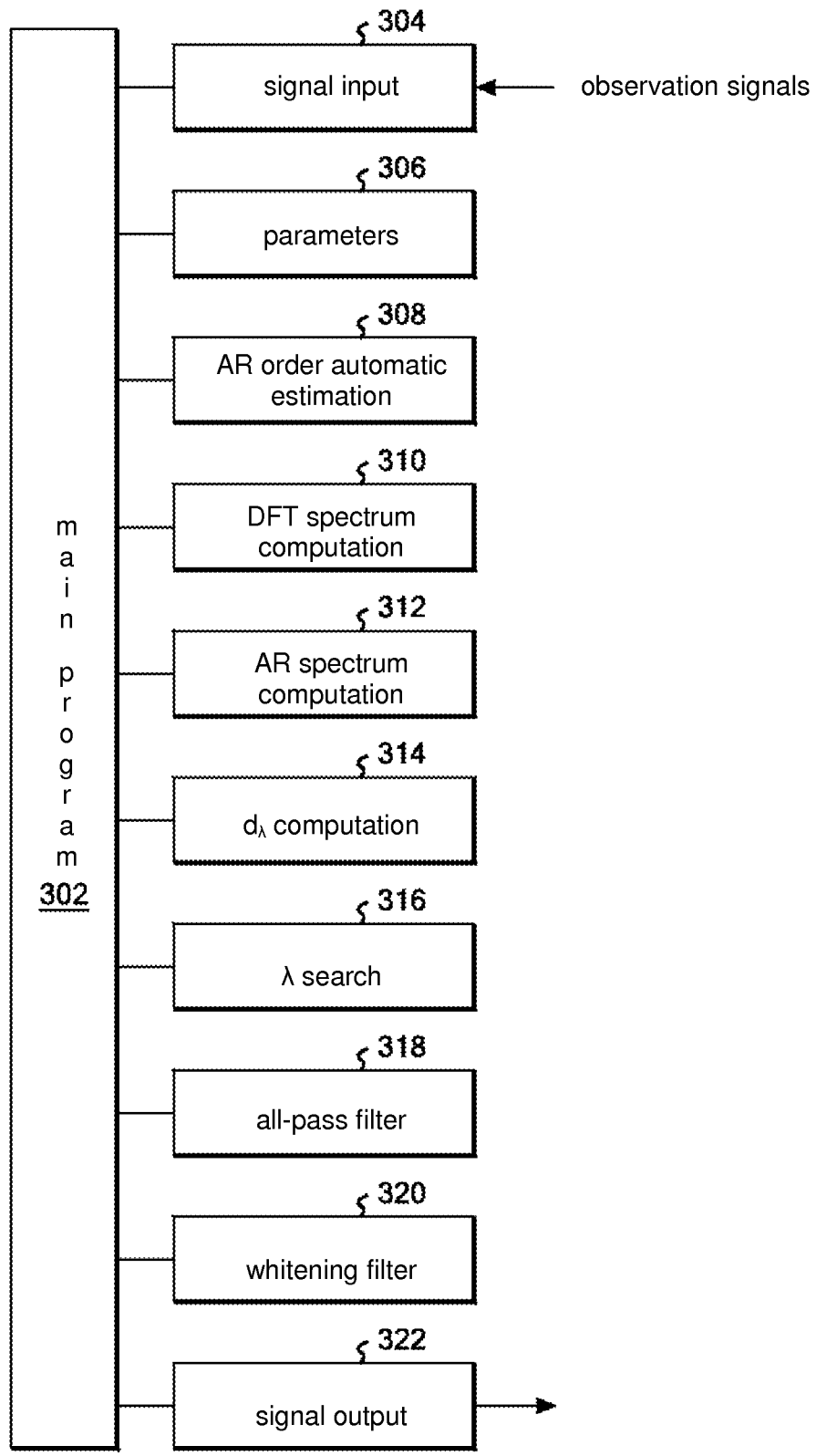
FIG. 3 is a function block diagram of the process used to determine the warp parameters λ.

FIG. 3 is block diagram showing in greater detail the functional configuration of the whitening filter and its configuration module 112 in the present invention.

In FIG. 3, the main program 302 controls all of the functions of the whitening filter and its configuration module 112. The parameters 306, which include the parameters used in the computations, are stored in the flash memory 208 or in a particular ROM (not shown).

When appropriate, the main program 302 calls up and executes the signal input routine 304, the AR order automatic estimation routine 308, the DFT spectrum computational routine 310, the AR spectrum computational routine 312, the spectral distance dλ computational routine 314, the warp parameter λ search routine 316, the all-pass filter 318, the whitening filter 320, and the signal output routine 322.

These programs and routines can be created using any well-known programming language, such as C, C++, Assembler, or Java®.

The AR order automatic estimation routine 308 automatically estimates the AR order using Akaike information criterion (AIC). More specifically, the following computation is performed. In other words, the $p^{th}$ AR model is described as follows.

$$x_n + \sum_{i=1}^{p} a_i x_{n-i} = e_n \qquad \text{[Equation 1]}$$

Here, ai is the AR model coefficient, and en is the error term. The logarithmic likelihood is described as follows.

$$L(\hat{\theta}) = -\frac{N}{2}\ln(2\pi\hat{\sigma}_e^2) - \frac{1}{2\hat{\sigma}_e^2}\sum_{m=1}^{N}(x_m - \hat{\mu})^2 \qquad \text{[Equation 2]}$$

Here, θ is the AR parameter vector, N is the number of observation data, and the following expresses the mean square of the AR model prediction error.

$$\hat{\sigma}_e^2 \qquad \text{[Equation 3]}$$

This equation takes the maximum value in the following case:

$$\hat{\mu} = \frac{1}{N}\sum_{m=1}^{N} x_m \qquad \text{[Equation 4]}$$

$$\hat{\sigma}_e^2 = \frac{1}{N}\sum_{m=1}^{N}(x_m - \hat{\mu})^2$$

In this case, the equation is as follows.

$$L_{max}(\hat{\theta}) = const. - \frac{N}{2}\ln \hat{\sigma}_e^2 \qquad \text{[Equation 5]}$$

Because the constant parts are unrelated to the AIC comparison of the order estimation, the equation can be described as follows.

$$AIC = N \ln \hat{\sigma}_e^2 + 2p \qquad \text{[Equation 6]}$$

AR order p is automatically estimated by determining the p which minimizes this equation.

The AR order estimating method can use the final prediction error (FPE) instead of an AIC. A technique can also be used in which a covariance matrix is determined for the observation signals, the eigenvalues are placed in descending order, and the order that experiences hardly any change in the eigenvalues is used as the estimated order.

Let xn, λ be the signal passed through the all-pass filter 318 for observation signal xn. In other words, xn, λ=A(z$^{-1}$,λ)xn. Here, the following is obtained.

$$A(z^{-1}, \lambda) = \frac{-\lambda + z^{-1}}{1 - \lambda z^{-1}} \qquad \text{Equation 7}$$

Then, the discrete Fourier transform (DFT) computational routine 310 computes the power spectrum via an N-point discrete Fourier transform using the following equation.

$$S_{DFT}(i, \lambda) = \frac{1}{N}\left|\sum_{n=0}^{N-1} x_{n,\lambda}\exp\left(-j\frac{2\pi ni}{N}\right)\right|^2, \qquad \text{[Equation 8]}$$

$$(0 \le i \le N - 1)$$

Similarly, when the p$^{th}$ (p≤N) AR model has been estimated using the following equation, $$x_n + \sum_{k=1}^{p} a_k x_{n-k} = e_n \qquad \text{[Equation 9]}$$

a signal passed through the all-pass filter 318 can be expressed in the AR model as follows.

$$x_{n,\lambda} + \sum_{k=1}^{p} a_{k,\lambda} x_{n-k,\lambda} = e_{n,\lambda} \qquad \text{[Equation 10]}$$

Then, the AR computational routine 312 computes the N-point power spectrum using the following equation.

$$A_{AR}(i, \lambda) = \frac{1}{N}\frac{\hat{\sigma}_{e,\lambda}^2}{\left|1 + \sum_{k=1}^{p} a_{k,\lambda}\exp\left(-j\frac{2\pi ki}{N}\right)\right|^2}, \qquad \text{[Equation 11]}$$

$$(0 \le i \le N - 1)$$

Here, the following is the mean square of the prediction error.

$$\hat{\sigma}_{e,\lambda}^2$$

The dλ computational routine 314 computes the spectral distance dλ in the following equation using the results of the DFT spectrum computational routine 310 and the AR spectrum computational routine 312.

$$d_\lambda = \frac{\max(S_0, S_\lambda)}{\min(S_0, S_\lambda)}\frac{1}{\alpha}\sum_{i=N-\alpha+1}^{N}(S_{DFT}^{Sort}(i, \lambda) - S_{AR}^{Sort}(i, \lambda))^2 \qquad \text{[Equation 13]}$$

Here, $$S_0 = \sum_{i=N-\alpha+1}^{N} S_{DFT}^{Sort}(i, 0), \qquad \text{[Equation 14]}$$

$$S_\lambda = \sum_{i=N-\alpha+1}^{N} S_{DFT}^{Sort}(i, \lambda)$$

and this serves to avoid a situation in which the pole is crushed by the warp in the opposite direction when the initial max( )/min( ) term on the right side of the equation for the spectral distance dλ and the next 1/α term are penalty terms.

$$S_{DFT}^{Sort}(i,\lambda) \qquad \text{[Equation 15]}$$

The equation above expresses the i$^{th}$ component when 2N point DFT spectra computed by the DFT spectrum computational routine 310 for a signal passed through an A(z$^{-1}$, λ) all-pass filter 318 corresponding to normalized frequencies 0 through π, and the N spectra have been sorted by size.

$$S_{AR}^{Sort}(i,\lambda) \qquad \text{[Equation 16]}$$

The equation above expresses the i$^{th}$ component when a signal passed through an A(z$^{-1}$, λ) all-pass filter 318 has been p$^{th}$ system identified, the 2N point AR spectra of the AR coefficient computed by the AR spectrum computational routine 312 corresponding to normalized frequencies 0 through π have been obtained, and the N spectra have been sorted by size.

Also, the value for a used to trim the lower terms of the sum is not strict, but is set to about 20% of the points in the discrete Fourier transform. For example, a power of two such as 128, 256, or 512 is preferably chosen as the number of points in the discrete Fourier transform. If the number of points is 256, the value for α is about 50. The value for α and the value for the number of points N in the discrete Fourier transform are stored beforehand as parameters 306.

Returning to FIG. 3, the λ search routine 316 searches for a λ value which reduces the spectral distance dλ the most within the approximate range of the given λ.

The whitening filter 320 performs reverse-filtering or whitening using the AR parameter estimated with the given λ. The processing performed by the whitening filter 320 will be explained in greater detail below with reference to FIG. 5.

The signal output routine 322 provides the signals reverse-filtered by the whitening filter 320 and all-pass filtered with λ to the observation attitude controller 110 or ambient noise canceller 108 shown in FIG. 1.

Figure 4:
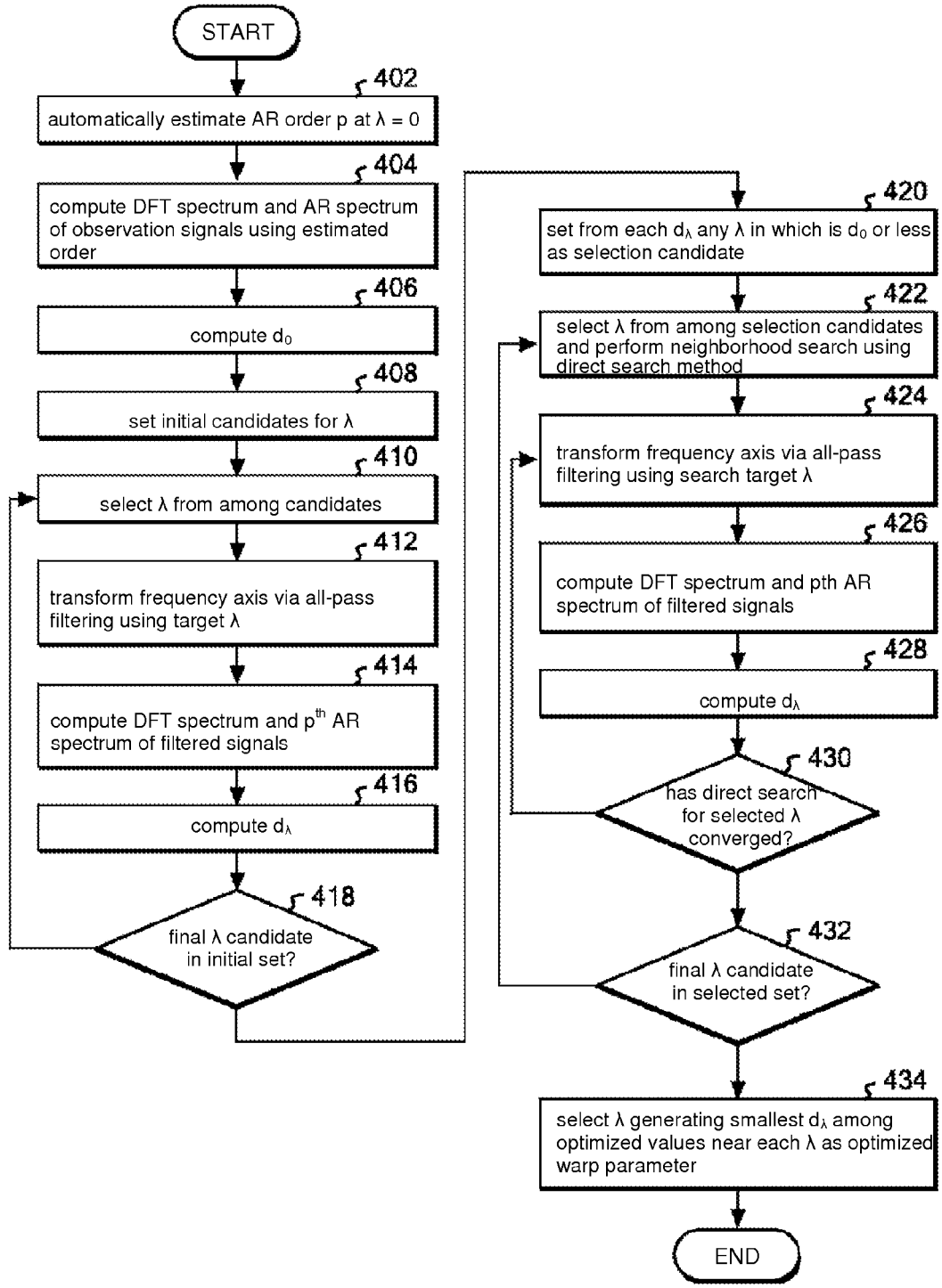
FIG. 4 is a flowchart showing the process used to determine the warp parameters λ.

The following is an explanation of the processing performed to determine the optimum warp parameter λ with reference to the flowchart in FIG. 4. This processing is executed by the main program 302 by calling up the various routines shown in FIG. 3 when appropriate.

In Step 402 of FIG. 4, the main program 302 calls up the AR order automatic estimation routine 308 after reading a particular number of observation signals from the signal input routine 304, and automatically estimates the AR order p for λ=0.

Next, in Step 404, the main program 302 calls up the DFT spectrum computational routine 310 and the AR spectrum computational routine 312 to compute the DFT spectrum and AR spectrum of the observation signals.

Next, in Step 406, the main program 302 calls up the spectral distance dλ computational routine 314 to compute d0, which is the value for the spectral distance dλ when λ=0.

Next, in Step 408, the main program 302 sets the initial candidates for λ. Here, λ is divided equally from −1.0 to 1.0 to obtain the set of real numbers (−1.0, −0.9, −0.8, −0.7, ..., 0.7, 0.8, 0.9, 1.0) serving as the initial candidates for A. The number of divisions should be fine enough to compute the optimum λ. However, the processing time increases when the number of divisions is too fine. Thus, a suitable number of divisions must be selected.

Next, in Step 410, the main program 302 selects a value from among the initial candidates for λ. For example, λ=−1.0 is selected first.

Next, in Step 412, the main program 302 calls up all-pass filter 318 to transform the frequency axis by performing all-pass filtering on the observed signals.

Next, in Step 414, the main program 302 calls up the DFT spectrum computational routine 310 and the AR spectrum computational routine 312 to compute the DFT spectrum and AR spectrum of the filtered observation signals.

Next, in Step 416, the main program 302 calls up the dλ computational routine 314 to compute the spectral distance dλ.

Next, in Step 418, the main program 302 determines whether the final candidate for λ in the initial set has been reached. In this example, the final candidate is 1.0. If not, the process returns to Step 410 and another λ value is selected among the candidates. Here, when the previous λ value was −0.9, the next λ value selected is −0.8.

When the final λ value in the initial set has been reached, the main program 302 proceeds to Step 420, and the λ values with a spectral distance dλ of d0 or less computed for each candidate are selected from among the final λ values of the initial set as the selection candidates.

Next, in Step 422, the main program 302 selects a λ value from among the candidates, calls up the λ search routine 316, and searches for λ in the neighborhood [λ−δ, λ+δ] of the λ value (δ is a small real number).

Next, in Step 424, the main program 302 uses the retrieved λ, calls up the all-pass filter 318, and transforms the frequency axis by performing all-pass filtering on the observation signals.

Next, in Step 426, the main program 302 calls up the DFT spectrum computational routine 310 and the AR spectrum computational routine 312 to compute the DFT spectrum and AR spectrum of the filtered observation signals.

Next, in Step 428, the main program 302 calls up the dλ computational routine to compute the spectral distance dλ.

Next, in Step 430, the main program 302 determines whether or not the direct search of the selected λ values has converged. Here, convergence means, for example, a criterion for searched λ values in which the spectral distance dλ is less than or equal to a predetermined threshold value, or the spectral distance dλ of a retrieved λ value has been reduced by a predetermined value with respect to the spectral distance dλ of the selected λ value.

When it has been determined that the direct search of selected λ values has not converged, the process returns to Step 424. The neighborhood search is continued, and the computation in Step 424 is continued on another retrieved λ value. When there has been no convergence in Step 430 within a predetermined amount of time or after a predetermined number of searches, the direct search for λ values is aborted.

When it has been determined in Step 430 that the direct search of selected λ values has converged, the main program 302 returns to Step 432 to determine whether the candidate for λ in the selection set is the final candidate. If not, the process returns to Step 422, another λ is selected from the selection set. If the candidate for λ in the selection set is the final candidate, the main routine in Step 434 selects as the optimized warp parameter the λ generating the smallest spectral distance dλ among the optimized values near each λ, and the process is ended.

Figure 5:
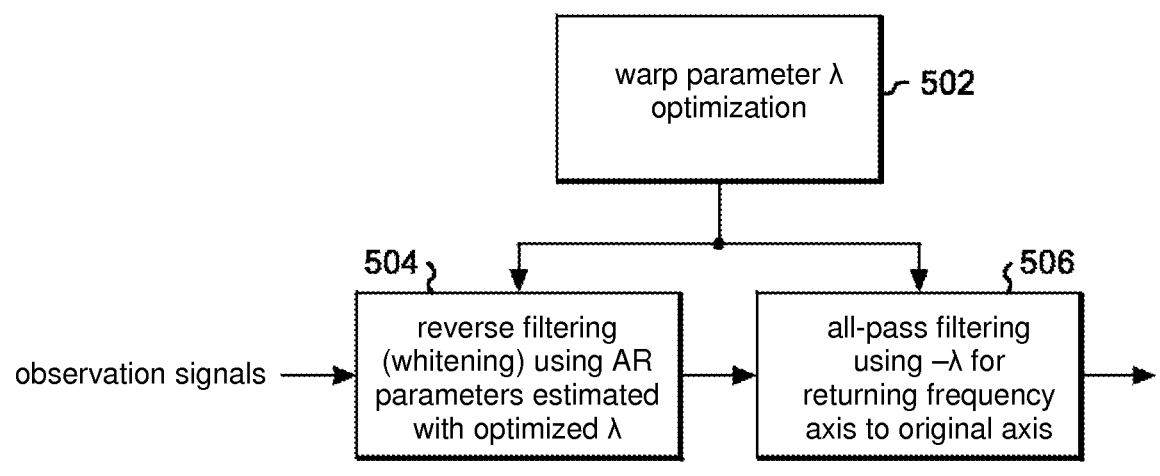
FIG. 5 is a diagram showing the processing performed by the whitening filter.

The following is an explanation of the operations performed by the whitening filter 320 using the optimized warp parameter λ with reference to FIG. 5. As indicated by reference number 502 in FIG. 5, when an optimized warp parameter λ has been determined as a result of the processing shown in the flowchart of FIG. 4, the parameter is used by the whitening filter 320 when reverse-filtering (whitening) is performed in Step 504 using the AR parameter estimated by the optimized λ, and by the all-pass filter 318 when performing all-pass filtering in Step 506 using −λ to restore the original frequency axis.

More specifically, let an observation signal be xn. The whitening filter 320 uses the following equation to generate a signal in which the frequency axis has been warped.

$$A(z^{-1}, \lambda)x_n = \frac{-\lambda + z^{-1}}{1 - \lambda z^{-1}} x_n \qquad \text{[Equation 17]}$$

When this is placed with $x_n^w$, the whitening filter 320 estimates the AR parameters in the following equation, assuming there is an AR model for this $x_n^w$.

$$x_n^w + \sum_{i=1}^{p} a_i^w x_{n-i}^w = e_n^w \quad \text{[Equation 18]}$$

The following is a representation of the transfer function.

$$x_n^w = \frac{1}{1 + \sum_{i=1}^{p} a_i^w z^{-i}} e_n^w \quad \text{[Equation 19]}$$

Thus, reverse filtering (whitening) entails the following operation.

$$\left(1 + \sum_{i=1}^{p} a_i^w z^{-i}\right) x_n^w \quad \text{[Equation 20]}$$

In other words, filtering is performed so that only $e_n^w$ is outputted. Here, $e_n^w$ is white noise, because this is the definition of the AR model. Hence, whitening has been performed. This process is executed in Step 504.

In Step 506, all-pass filtering is performed in the following manner to return the frequency axis to the original axis.

$$\frac{\lambda + z^{-1}}{1 + \lambda z^{-1}} e_n^w \quad \text{[Equation 21]}$$

The present invention was explained above using an example in which observation signals from an artificial satellite have been whitened. However, the present invention is not limited to this example. It can be applied to whitening filters in any field. The whitening filter of the present invention has especially beneficial effects in low-SN ratio situations.

What is claimed is:

1. A computer-implemented method for configuring a whitening filter from observation signals, the method comprising the steps of:

automatically estimating an auto-regressive (AR) order based on the observation signals outputted from an all-pass filter using a warp parameter of $\lambda=0$;

computing, based on the AR order, a discrete fourier transform (DFT) spectrum and an AR spectrum of the signals outputted from the all-pass filter using the warp parameter of $\lambda=0$;

executing steps (a) through (c) for the signals outputted from the all-pass filter using multiple values of the warp parameter $\lambda$, wherein each execution of steps (a) through (c) uses a different value for the warp parameter $\lambda$:

(a) performing frequency axis transformation via all-pass filtering using the value of $\lambda$, (b) computing a DFT spectrum and an AR spectrum for the signals filtered during step (a), and (c) computing the spectral distance $d\lambda$ using a sum of the components of the DFT spectrum computed with the signals outputted from the all-pass filter using $\lambda=0$, the sum of the components of the DFT spectrum computed using the signal outputted from the all-pass filter using the value of $\lambda$, and the sum of squares error of the AR spectrum;

selecting the warp parameter $\lambda$ with a minimum spectral distance $d\lambda$; and estimating an AR parameter from the signals outputted from the all-pass filter using the selected warp parameter $\lambda$ and configuring a whitening filter based on the AR parameter.

2. The method for configuring a whitening filter according to claim 1, wherein the step of computing the spectral distance using the sum of the components of the DFT spectrum is performed by sorting the components of the DFT spectrum in descending order, and computing the sum of a predetermined number of top components.

3. The method for configuring a whitening filter according to claim 1, wherein computing the spectral distance $d\lambda$ further comprises multiplying the sum of the components of the DFT spectrum by the term $\max(d0, d\lambda)/\min(d0, d\lambda)$, wherein $d0$ is the value for $d\lambda$ when $\lambda=0$.

4. The method for configuring a whitening filter according to claim 1, wherein the step of automatically estimating AR order is based on Aikake information criterion.

5. The method of claim 1, further comprising executing all-pass filtering using $-\lambda$ to return the frequency axis to the original axis.

6. A computer-executed program for configuring a whitening filter from observation signals, the computer executed program comprising program instructions which are stored on one or more tangible computer-readable storage devices and the program instructions executed on a computer, the program instructions comprising:

program instructions to automatically estimate an auto-regressive (AR) order based on the observation signals outputted from an all-pass filter using a warp parameter of $\lambda=0$;

program instructions to compute, based on the AR order, a discrete fourier transform (DFT) spectrum and an AR spectrum of the signals outputted from the all-pass filter using the warp parameter of $\lambda=0$;

program instructions to execute steps (a) through (c) for the signals outputted from the all-pass filter using multiple values of the warp parameter $\lambda$, wherein each execution of steps (a) through (c) uses a different value for the warp parameter $\lambda$:

(a) program instructions to perform frequency axis transformation via all-pass filtering using the value of $\lambda$, (b) program instructions to compute a DFT spectrum and an AR spectrum for the signals filtered during step (a), and (c) program instructions to compute the spectral distance $d\lambda$ using a sum of the components of the DFT spectrum computed with the signals outputted from the all-pass filter using $\lambda=0$, the sum of the components of the DFT spectrum computed using the signal outputted from the all-pass filter using the value of $\lambda$, and the sum of squares error of the AR spectrum;

program instructions to select the warp parameter $\lambda$ with a minimum spectral distance $d\lambda$; and program instructions to estimate an AR parameter from the signals outputted from the all-pass filter using the selected warp parameter $\lambda$ and configuring a whitening filter based on the AR parameter.

7. The program for configuring a whitening filter according to claim 6, wherein the program instructions to compute the spectral distance using the sum of the components of the DFT spectrum is performed by sorting the components of the DFT spectrum in descending order, and computing the sum of a predetermined number of top components.

8. The program for configuring a whitening filter according to claim 6, wherein the program instructions to compute the spectral distance $d\lambda$ further comprises multiplying the sum of the components of the DFT spectrum by the term $\max(d0, d\lambda)/\min(d0, d\lambda)$, wherein $d0$ is the value for $d\lambda$ when $\lambda=0$.

9. The program for configuring a whitening filter according to claim 6, wherein the program instructions to automatically estimate AR order is based on Aikake information criterion.

10. A computer-implemented system for configuring a whitening filter from observation signals, the system comprising:
- means for automatically estimating an auto-regressive (AR) order based on the observation signals outputted from an all-pass filter using a warp parameter of $\lambda=0$;
- means for computing, based on the AR order, a discrete fourier transform (DFT) spectrum and an AR spectrum of the signals outputted from the all-pass filter using the warp parameter of $\lambda=0$;
- means for executing steps (a) through (c) for the signals outputted from the all-pass filter using multiple values of the warp parameter $\lambda$, wherein each execution of steps (a) through (c) uses a different value for the warp parameter $\lambda$:
  - (a) performing frequency axis transformation via all-pass filtering using the value of $\lambda$,
  - (b) computing a DFT spectrum and an AR spectrum for the signals filtered during step (a), and
  - (c) computing the spectral distance $d\lambda$ using a sum of the components of the DFT spectrum computed with the signals outputted from the all-pass filter using $\lambda=0$, the sum of the components of the DFT spectrum computed using the signal outputted from the all-pass filter using the value of $\lambda$, and the sum of squares error of the AR spectrum;
- means for selecting the warp parameter $\lambda$ with a minimum spectral distance $d\lambda$; and
- means for estimating an AR parameter from the signals outputted from the all-pass filter using the selected warp parameter $\lambda$ and configuring a whitening filter based on the AR parameter.

11. The system for configuring a whitening filter according to claim 10, wherein the step of computing the spectral distance using the sum of the components of the DFT spectrum is performed by sorting the components of the DFT spectrum in descending order, and computing the sum of a predetermined number of top components.

12. The system for configuring a whitening filter according to claim 10, wherein computing the spectral distance $d\lambda$ further comprises multiplying the sum of the components of the DFT spectrum by the term $\max(d0, d\lambda)/\min(d0, d\lambda)$, wherein $d0$ is the value for $d\lambda$ when $\lambda=0$.

13. The system for configuring a whitening filter according to claim 10, wherein the step of automatically estimating AR order is based on Aikake information criterion.

* * * * *